United States Patent
Reading et al.

(10) Patent No.: US 12,146,901 B1
(45) Date of Patent: Nov. 19, 2024

(54) SYSTEM AND METHOD FOR PROVIDING INFORMATION ON MEASUREMENT ERRORS FOR INSTRUMENTS

(71) Applicant: Keysight Technologies, Inc., Santa Rosa, CA (US)

(72) Inventors: Ian Reading, Edinburgh (GB); Paul Duncan, Glasgow (GB); Eric Breakenridge, Clackmannanshire (GB); Colin M. Arthur, Edinburgh (GB)

(73) Assignee: KEYSIGHT TECHNOLOGIES, INC., Santa Rosa, CA (US)

( * ) Notice: Subject to any disclaimer, the term of this patent is extended or adjusted under 35 U.S.C. 154(b) by 399 days.

(21) Appl. No.: 17/508,323

(22) Filed: Oct. 22, 2021

(51) Int. Cl.
*G01R 19/32* (2006.01)
(52) U.S. Cl.
CPC .................................. *G01R 19/32* (2013.01)
(58) Field of Classification Search
CPC ......... G01R 19/00; G01R 19/32; G01D 21/00
See application file for complete search history.

(56) References Cited

U.S. PATENT DOCUMENTS

| | | | | |
|---|---|---|---|---|
| 2008/0125982 A1* | 5/2008 | Yoshihiro | ............... | G01D 18/00 702/53 |
| 2015/0177315 A1* | 6/2015 | Lim | ....................... | G01R 21/10 702/108 |
| 2017/0160369 A1* | 6/2017 | Leibfritz | ............ | G01R 31/3191 |
| 2023/0127538 A1* | 4/2023 | Hagino | ................ | G01B 21/045 702/85 |

* cited by examiner

*Primary Examiner* — Manuel L Barbee

(57) ABSTRACT

An instrument for measuring a physical quantity, an instrument system having a plurality of such instruments, and a method for operating such a system are described. The instrument includes a sensor, an instrument class error calculator and a communication interface. The sensor measures the physical quantity and generates a value, Vm, for the physical quantity. The instrument class error calculator provides an instrument class error associated with Vm. The instrument system includes a plurality of these instruments that are manufactured on an ongoing basis. The instrument system includes a database that stores a measurement generated by each instrument in a sample of the instruments during manufacture and a communication link between the database and one of the instruments in the class that provides information on the instruments based on measurements made after the one of the instruments in the class was manufactured.

19 Claims, 2 Drawing Sheets

SYSTEM AND METHOD FOR PROVIDING INFORMATION ON MEASUREMENT ERRORS FOR INSTRUMENTS

BACKGROUND

The user of a measurement instrument often needs to know the accuracy of a measurement provided by that instrument. The measurement provided by the instrument will, in general, have two sources of error. The first is the result of random errors that can be measured by repeating the measurement a number of times with the same instrument and observing the statistical distribution of the results. The user can make this determination, since it only involves repeating the measurements with the same instrument under the same environmental conditions.

The second source will be referred to as instrument class errors. Typically, an instrument manufacturer produces a class of instruments that are intended to be interchangeable. Consider the case of a digital volt meter (DVM) of a particular make and model. Ideally, a user can use any one of these DVMs to measure the voltage on a terminal. That is, the user would receive the same measured value independent of the specific DVM from the class used. In practice, different DVMs will provide slightly different values.

There are numerous sources for this variability among the instrument class. To the extent that a manufacturer can reduce or eliminate a source of variability without significantly increasing the cost of the instrument, a manufacturer will provide those improvements. For the purposes of this disclosure, it is sufficient to note that providing a user of an instrument with the probability that the user will see a different value measured if the user were to select another instrument from the product line presents significant challenges.

In principle, a manufacturer of an instrument class can measure a probability density function (PDF) that describes the instrument-to-instrument variations among the individual instruments that make up that class. Given such a distribution and a "level of confidence", a range of values can be specified such that when an instrument measures a value, Vm, a different one of the instruments measuring the same source would have produced a value between VLow<Vm<VHigh a percentage of the time defined by the level of confidence. For example, if the level of confidence were set to 90%, VLow and VHigh would be determined such that 90 percent of the PDF lies between these two values.

Consider the case of a DVM. The PDF provides the probability that a different instrument in the class would measure a value V' for the voltage on a terminal when the current instrument measures a value Vm. If the DVMs were perfect, the PDF would be a delta function; however, individual instruments in the class are not perfect. In principle, the PDF could be generated by measuring a known standard, exhibiting a voltage, Vs, with each instrument after the instrument had been calibrated and passed a quality control test. The resulting measurements could then be histogramed to generate a PDF that relates the probability that any one instrument would measure a value between Vm and Vm+8V for the values of Vm returned in the measurements. Even in this relatively simple measurement example, hundreds of instruments must be measured to provide a statistically valid estimate of the PDF.

Unfortunately, measuring the same standard with every instrument produced poses significant additional challenges. Hence, in practice, a number of "standards" are used. The standards in this case have a distribution of values, and hence, are also characterized by a PDF that provides the probability that a given instrument was tested against a "standard" having value V. If the width of this second PDF is of the same size as the PDF representing the instruments, additional hundreds of instrument measurements will be needed to accurately determine the PDF of the instruments.

The initial data available to measure the PDF can involve a relatively small number of instruments of a particular type, as instruments are sold before a large number of instruments are made and calibrated. Furthermore, the range of environmental parameters over which the calibrations are made is significantly less than the full range of environmental conditions in which the instrument will be utilized in the field. To overcome these limitations, the manufacturer often assumes a particular functional form for the PDF, e.g. a normal distribution, and estimates the parameters of that distribution using a relatively small number of available instruments in the initial manufacturing runs. The estimate of the parameters of the PDF obtained in this manner may differ from the parameters of the PDF and the shape of the PDF that would be obtained from a much larger sample size.

To simplify the following discussion, again consider the case of a PDF that is a normal distribution. Denote the standard deviation provided by the initial small sample by $\sigma_1$. Denote the standard deviation that would be obtained from a very large number of instruments from the class by $\sigma_0$. The user is interested in knowing VLow and VHigh at some confidence level. If the user uses a $\sigma$ value that is greater than $\sigma_0$, the resulting measurement range will be too large. That is, there will be a smaller range of values that represents the outcome of using a different instrument from the class at the stated level of confidence. If this enlarged range is still within the acceptable limits for the user's application, the instrument can still be used with confidence for the application. If the range is too large for the user's application, then the user must have the instrument calibrated or otherwise obtain a better estimate of the potential class error for the user's particular instrument.

If, however, the $\sigma$ value is less than 00, the resultant range will be too small, and the user will be given a false sense of security in the measurement. That is, the range of values for the measurement is actually larger than the stated range at the confidence level in question.

In general, it is more important to have confidence in the range. Hence, the manufacturer typically increases the width of the PDF to provide some safety margin, and hence, the stated instrument class error range is often significantly larger than the actual range encountered under field conditions. While this procedure ensures the user that the VLow and VHigh do define the measurement interval for the stated confidence level, the actual VLow and VHigh values for that confidence level lie within this range.

As noted above, the stated instrument class errors are often increased for the early versions of the instrument to ensure that the values are sufficient to provide the desired reliability for the user assuming that the user finds the VLow and VHigh values acceptable for the user's application. While this approach guarantees that the instruments will perform within the stated limits in the field, there are applications in which a better estimate is needed. As the required accuracy of the measurements increases, the user may need a measurement accuracy that is better than the stated accuracy which includes the "safety margin" used by the manufacturer. In such cases, the user needs a better error estimate of the instrument class errors that takes into account knowledge gained over the manufacture of additional instruments since the user's instrument was produced and that takes into account the environmental conditions of the measurement and any improvements in the instrument class error range.

Instrument manufacturers often provide written specifications that detail the worst case instrument class errors for a given confidence level. These values will, in general, depend on environmental factors such as the temperature at which the measurements are made. It would be advantageous to provide the user with range of values for the desired confidence level for the measurements currently being made under the current environmental conditions, rather than requiring the user to look up that information in a written specification or spread sheet that accompanies the instrument.

SUMMARY

The present disclosure is directed to an instrument for measuring a physical quantity, an instrument system having a plurality of such instruments, and a method for operating such a system. The instrument includes a sensor, an instrument class error calculator and a communication interface. The sensor measures the physical quantity and generates a value, Vm, for the physical quantity. The instrument class error calculator provides an instrument class error associated with Vm. The communication interface transfers the instrument class error to an entity separate from the instrument.

In one aspect, the class error associated with Vm includes VLow and VHigh, where VLow<Vm<VHigh and a probability of another instrument from the class providing a reading, V, when measuring the physical quantity is between VLow and VHigh for a percentage of the instruments in the class determined by a specified confidence level.

In one aspect, the class error associated with Vm includes specified values for a VLow and a VHigh, where VLow<Vm<VHigh and a probability of another instrument from the class providing a reading, V, when measuring the physical quantity is between VLow and VHigh for a percentage of the instruments in the class that has a confidence level determined by the instrument class error calculator.

In one aspect, the instrument is a member of a class of instruments and wherein the instrument class error calculator stores information specifying a PDF for Vm representing the instrument class errors across the class of instruments based on measurements made by other instruments in the class of instruments.

In one aspect, the other instruments were placed in service after the instrument.

In one aspect, the PDF depends on a temperature at which the sensor is operating.

In one aspect, the instrument belongs to a class of instruments and wherein the instrument further includes a communication link that connects the instrument to a server that stores updated PDF information based on measurements of other instruments of the class that were produced after the instrument was placed in service.

In one aspect, the PDF is chosen from a predetermined list of candidate PDFs, each candidate PDF in the list including a free parameter that is determined by fitting the candidate PDFs to measurements made by a plurality of instruments in the class of instruments, the PDF is chosen to be the candidate PDF that best fits the measurements.

In one aspect, the plurality of instruments in the class of instruments was placed in service after the instrument.

In one aspect, the free parameter is increased to compensate for uncertainty in determining which candidate PDF best fitted the measurements.

An instrument system according to the present disclosure includes a plurality of instruments of a class of instruments that is manufactured on an ongoing basis. Each instrument includes a sensor that measures a physical quantity and generates a value, Vm, for the physical quantity, and an instrument class error calculator that provides an instrument class error associated with Vm to a user of the instrument. The instrument system includes a database that stores a measurement generated by each instrument in a sample of the instruments during manufacture and a communication link between the database and one of the instruments in the class that provides information on the instruments in the class based on measurements made after the one of the instruments in the class was manufactured.

In one aspect, the instrument class error calculator stores information specifying a PDF for Vm representing the instrument class errors across the class of instruments based on measurements made on other instruments in the class of instruments.

In one aspect, the system includes a controller that utilizes the database to specify a current PDF for the instruments in the class based on measurements made on the class of instruments.

In one aspect, the controller communicates the current PDF to one of the instruments, the current PDF is based on measurements made on the class of instruments after the one of the instruments was placed into service.

In one aspect, the current PDF depends on an environmental variable.

In one aspect, the environmental variable is temperature.

The present disclosure also includes a method for operating an instrument system that includes a plurality of instruments of a class of instruments in which each instrument includes a sensor that measures a physical quantity and generates a value, Vm, for the physical quantity and an instrument class error calculator that provides an instrument class error associated with Vm to a user of the instrument. The system also includes a database that stores a measurement generated by each instrument in a sample of the instruments and a communication link between the database and one of the plurality of instruments in the class. The method includes measuring a value for the physical quantity on a standard using selected ones of the instruments and storing information specifying the measured values in the database together with information specifying an environmental parameter associated with the measured values and transmitting information specifying a new PDF for the physical quantity to the one of the instruments based on information stored in the database after the one of the instruments was placed in service.

In one aspect, the measuring of the values of the physical quantity occurs after the one of the instruments was placed in service.

In one aspect, the new PDF depends on an environmental parameter.

In one aspect, the environmental parameter is temperature.

DETAILED DESCRIPTION

In this disclosure, a "class" of instruments is defined to be a plurality of instruments provided by the same instrument supplier in which each instrument in the class is interchangeable with any other instrument in the class. Each instrument measures a physical quantity. Ideally, the instruments in the class are identical to one another. Each instrument in the class measures a physical parameter. In the ideal class, the value of the physical parameter would be the same independent of the specific instrument from the class used to make the measurement. In the "real world", the individual instruments in the class have small differences that lead to differences in the value of the physical parameter that depend on the specific instrument chosen from the class.

The manner in which the present invention provides its advantages can be more easily understood with reference to a test instrument that measures a single parameter, such as a voltage, e.g. a digital volt meter. In this example, the instrument has a single sensor that measures a potential on a terminal and converts that potential to the voltage between the terminal and a reference electrode that is displayed to the user.

As noted above, the user of the instrument needs to know the instrument class error for the value that was just measured under the environmental conditions of the sensor in the measurement. While instrument manufacturers provide some documentation of the instrument class error, the instrument itself does not provide such an error for the measurement just made that takes into account the environment of the measurement. Absent the user repeating the measurement with a number of different instruments of the class, the user cannot acquire this information based on a single instrument from the class.

In the present disclosure, an instrument class error provides a measure of the uncertainty in the measured quantity arising from instrument-to-instrument variations of the instrument class used to make the measurement. In one aspect, the instrument class error is provided by a range of measured values that would be produced by other instruments in the class measuring the same quantity a percentage of the time determined by confidence level. In another aspect, a range of values is specified by the instrument and confidence level associated with that range of values is provided by an error calculator associated with the instrument making the measurement.

Figure 1:
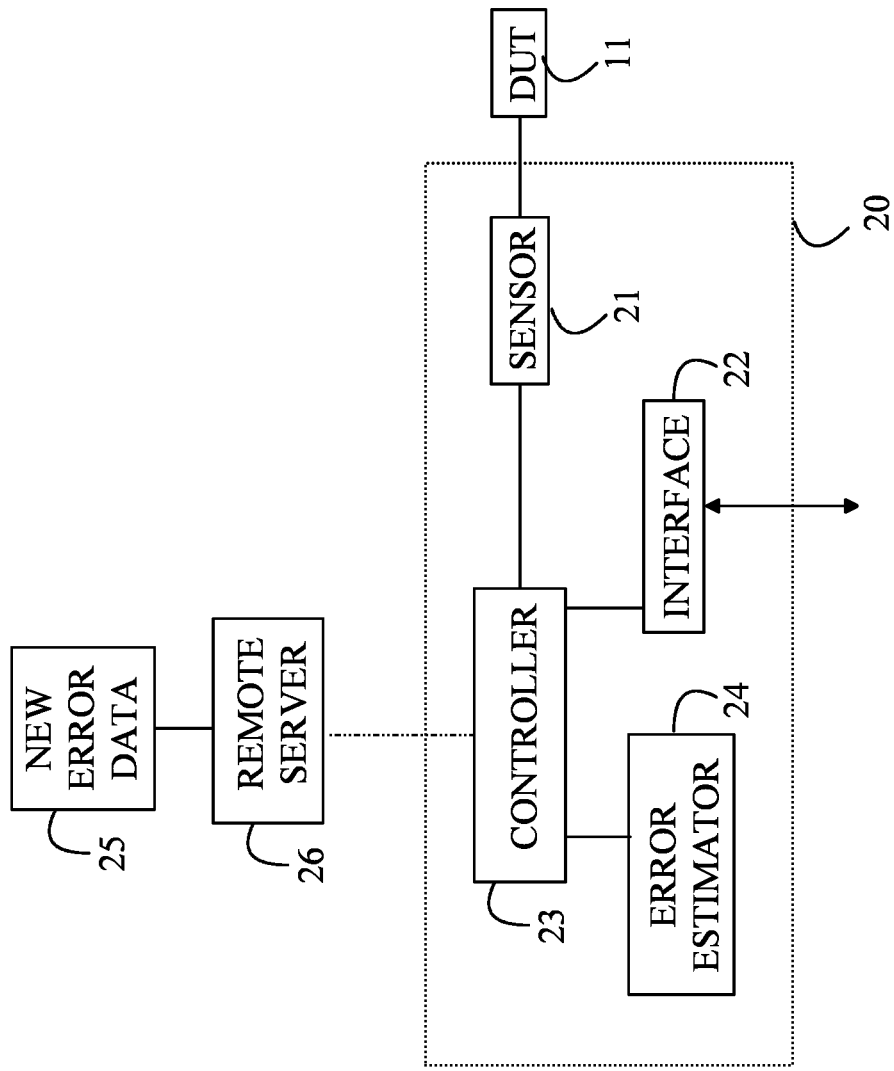
FIG. 1 illustrates a single sensor instrument that measures a parameter of a device under test (DUT).

Refer now to FIG. 1, which illustrates a single sensor instrument that measures a parameter of a DUT. Test instrument 20 includes a sensor 21 that measures a parameter of DUT 11 such as voltage. The measurement values are processed by a controller 23 that communicates the results through an interface 22 to an external system that utilizes the data. For example, test instrument 20 may be one of a number of instruments on a production line that examines the DUTs to determine if each DUT passes the test based on the range of measured values from sensor 21. Controller 23 also includes an error estimator 24 which provides an estimate of errors in the measurement from sensor 21 arising from instrument-to-instrument variations at a predetermined confidence level. This error data may also be sent to the external device or a user via interface 22.

While test instrument 20 is shown as having only a single sensor 21, it is to be understood that test instrument 20 might have additional sensors that are not shown. For example, test instrument 20 may include a temperature sensor which measures the temperature at which the measurement of DUT 11 is performed. As will be discussed in more detail below, error estimator 24 can take that temperature into account in estimating the error in the measurement provided by sensor 21.

Consider an instrument that is continuously being manufactured over an extended period of time. The first instruments that are measured are tested and an estimate of the instrument class errors obtained over a relatively small sample set before the instruments are sold and shipped to customers. To simplify the discussion, consider a DVM as the instrument in question. After the DVM is calibrated, the instrument class errors are estimated by using the DVM to measure "known" voltages provided by a standard voltage source. The difference between the known voltage and the average reading provided by the DVM over a number of measurements is a measure of the instrument class error for the temperature and voltage provided by the standard. In practice, a number of different "standards" may be used to measure the instrument class error on the production line or lines. The standards also have some distribution of errors and are characterized by the PDF. Hence, the resulting measurements have a PDF that includes the PDF of the standards. If the variations in the standards are significant compared to the variations from instrument to instrument, the measured PDF for the instruments based on the collection of standards will incorporate the standard's PDF and appear wider than the true instrument-to-instrument PDF. For the purposes of this discussion, it will be assumed that the errors in the standards are small compared to the instrument class errors of the DVM.

The customer must be able to count on the measurement value provided by the instrument to be correct to within the limits of the instrument class error and the confidence level corresponding to the instrument class errors. For example, assume that the instrument measures a value, V, for the DUT output. If the instrument was perfect, the instrument would provide a value Vc. The manufacturer provides an instrument class error estimate, $\Delta V_m$, for the instrument. That is, V is within the range, $V_c \pm \Delta V_m$ to within a confidence level specified by the manufacturer.

The range of possible values will depend on the confidence level, the shape of the statistical distribution of the instrument class errors as well as the width of that distribution. The detailed shape of the statistical distribution may not be known until well into the production of the instruments. This lack of knowledge is often handled by assuming a shape and providing a parameter that allows a conservative range of values to be determined for a specified confidence level. The resulting range of values will, in general, be too large for the assumed level of confidence. That is, the true range of values will be within the conservative range; however, the user can have confidence that another instrument would be within the conservative range at the stated level of confidence.

Given the limited sample size and other environmental factors such as temperature, sensor drift over time, etc., the estimate of $\Delta V$ obtained from measuring the first batch of instruments may be less than the true instrument class error. In one exemplary embodiment of a system according to the present disclosure, the manufacturer defines a "guard band" To compensate for the lack of confidence in the initially measured $\Delta V$ by increasing the value of the measured $\Delta V$ using a correction factor. This larger $\Delta V$ can then be used with the assumed shape of the instrument class error statistical distribution to arrive at a confidence level that the user can depend upon.

As time passes, the number of instruments that are tested increases, and the level of confidence with respect to the instrument class errors and the shape of the statistical distribution of those errors improves. The improved instrument class error data can then be used to reduce the correction factor. The test instrument owner may then be able to use the instrument in a setup that requires a smaller $\Delta V$.

Referring again to FIG. 1, in one aspect of an instrument according to the present invention controller 23 includes an interface for accessing a remote server 26 that stores a new error data 25 that is accumulated by the manufacturer. When this interface is activated controller 23 updates the error estimate in error estimator 24 to reflect new information that is accumulated from tests of the instrument in question.

It should be noted that the instrument class errors may be a function of other measurement parameters such as temperature, signal range, etc. As noted above, test instrument 20 may include other sensors that provide data that allow the instrument class errors to be more accurately computed by test instrument 20. In one aspect of an instrument according to the present disclosure, error estimator 24 includes a database and one or more algorithms that allow controller 23 to report the instrument class error associated with the current measurement and environment. In principle, test instrument 20 can utilize the data on remote server 26 to provide this information; however, remote server 26 may not always be accessible to test instrument 20. Accordingly, a local database that is updated periodically from remote server 26 is preferred.

The number of test instruments in the early production phase of a particular test instrument is typically insufficient to provide a good statistical distribution of the instrument class errors based on the "raw data". If there were a sufficient number of instruments tested, in principle, the system could determine a PDF that could be integrated to provide a measure of the instrument class error as a function of the desired certainty level without making any detailed assumptions with respect to shape of the PDF.

However, in practice, there is insufficient data in the early phases of the production of the instrument to utilize this approach. In addition, it is advantageous to provide an error computation module on the instrument that does not rely on a link to a central data depository or require the computational capability needed to process a large database.

In one aspect of a system according to the present disclosure, the system assumes that the PDF is well approximated by one of a plurality of pre-defined PDFs. Each candidate PDF includes a small number of parameters that are fitted to the actual measured distribution. In one aspect, the available data is used to provide these parameters and some measure of the "goodness" of the fit to that candidate distribution. The candidate PDF exhibiting the best fit to the data is then chosen as representing the PDF of the instrument class errors for that instrument class.

In one aspect of a system according to the present disclosure, the candidate PDFs include a normal distribution function, a log normal distribution function, a plurality of functions that are zero outside a predetermined range of error values and have a dome function that describes the distribution within the predetermined range. A dome function is defined to be a function having a positive value within the predetermined range. For example, a quadratic PDF is represented by the function $C1-C2x^2$ for x values between $-a$ and $+a$. Here, C1, C2, and a are chosen to provide the best fit to the data values and to normalize the function such that the integral of the PDF from $-a$ to $+a$ is equal to 1. In another example, the dome function is a constant between $-a$ and a and zero outside $[-a,a]$. The constant and a are chosen to best fit the data and provide the required normalization. In yet another example, the PDF increases linearly from 0 between $-a$ and 0 and then decreases linearly to zero from 0 to a. The slope and the value of "a" are chosen as described above to fit the data and provide the needed normalization.

In one aspect, one of the fitted parameters determines the width of the PDF that best fits the data. For example, the parameter "a" discussed above is such a parameter. In another example, the standard deviation of the normal distribution is such a parameter. If the relative "goodness" of the best fit versus the next best fit is not substantial, the parameter determining the width of the PDF is increased to reflect lack of a clear "winner".

As noted above, given a set of instruments, the instrument class errors for those instruments are measured under similar conditions such as temperature. Generally, the instrument class errors will be determined by comparison of the instrument's measurement to standards that are closer to national standards than instrument-to-instrument variability. This can be achieved by measuring a transfer standard that has been calibrated with a lower error or by comparing measurements with an instrument with the same measurement capability but with intrinsically lower error. For example, for a DVM, a voltage standard that has been calibrated at a calibration laboratory with an expected error <x can be used to determine the errors from an instrument with expected capability of 10x. Similarly, comparison of simultaneous measurements of a voltage source taken by a "standard" DVM and the instrument under test can be used to determine the errors. The candidate PDFs are then fit to the data set to determine the best values for the free parameters in each candidate PDF.

Once the best fit to each of the candidate PDFs is obtained, the PDFs are ranked by some measure of the goodness of the fit to the data. In one aspect, a PDF for the measurements is created by dividing the range of measured values into contiguous "bins" and counting the number of measured values in each bin. The distribution is then fitted to a candidate distribution using a least squares or similar method in which an error function is minimized by selecting the values for the parameters that specify the candidate PDF being tested. The minimum value of the error function is also a measure of the goodness of the fit. Hence, the PDFs can be ordered by the minimum value of the error function associated with each candidate distribution.

Each of the candidate PDFs includes a parameter that measures the width of the distribution, and hence, determines the width of the range of values corresponding to any given confidence level. As noted above, particularly during the early production phase of an instrument, the width of the distribution is amplified to provide a safety margin when estimating the uncertainties in the measurements made by the instrument. This ensures the user that the measured value from the instrument is within a certain range at some predetermined confidence level. In one aspect, the width of the distribution is increased such that a mistake in the identification of the correct PDF will not result in a measurement range that fails to provide the desired level of confidence. In another aspect, the increase is set with reference to the changes seen in other instruments between the initial sampling and the final PDF computed from a very large number of instruments.

As the number of instruments produced increases with time, the error distributions become statistically more accurate, and hence, this amplification can be reduced. This reduction assumes that the newer measurements satisfy the same statistical distribution as the previously sampled instruments. If this assumption is true, then the new measurements can be combined with the old measurements to provide a more accurate error distribution model, and the fitting process to the various models can be repeated with the larger data set to provide a better estimate of the statistical distribution. In some cases, the additional measurement set may be large enough to provide the statistical distribution directly from the measured values without assuming any particular model.

As new data becomes available for a particular instrument and measurement, it is advantageous to be able to test the new measurements against the existing measurements to determine if the new measurements and the previous measurements are consistent with each other. As noted above, if the new measurements and previous measurements are consistent with a single PDF, then the new measurements can be combined with the previous measurements to arrive at a better definition of the PDF that describes the measurements and that can be used by the instruments in the field to provide a more accurate value than the PDF computed from the more limited previous measurements.

In one exemplary embodiment, the Kolmogorov-Smirnov (K-S) test is used to test the two samples of the measured values to determine if the samples are consistent with belonging to the same PDF. If the two samples are consistent with belonging to a common PDF, then the above described procedure for selecting the best one of the candidate PDFs can be utilized. If the combined samples have sufficient numbers, a PDF can be determined from the raw data, without relying on assumptions about possible candidate PDFs.

In one aspect, if the K-S test indicates that the two samples are not consistent with the same PDF, the determination of the best PDF that fits the data is repeated using the new data as well as the older data.

Instrument class error measurements are made under a number of different environmental conditions. Providing the user with an error estimate involves having error measurements that are made under each of these combinations of environmental conditions. The size of the data set needed to provide such measurements can be excessive, since it would require that measurements be made under each possible combination of environmental conditions. Consider temperature and voltage range for a DVM. There will typically be a large number of measurements at or near room temperature for many voltage ranges. However, the amount of data at the extremes of the allowed measurement range is typically much smaller. Hence, providing accurate estimates of the errors at the extremes of the temperature range can be challenging if these measurements must also be made for each voltage range.

Assume that the PDF at room temperature is a normal distribution characterized by standard deviation $\sigma_r$. If the PDF remains a normal distribution with a standard deviation of $\sigma_t$ at temperature, t, and the standard deviations are not correlated with the voltage range data, then a model for $\sigma_t$ can be calculated that provides an approximation that can be used to predict the PDF at temperatures outside of the room temperature range. Since the number of measurements needed to calculate the standard deviation at any given temperature is relatively small, the model can be computed to cover a broad temperature range, provided the other environmental factors at the various temperatures are not correlated with the change in the instrument class errors with temperature.

Figure 2:
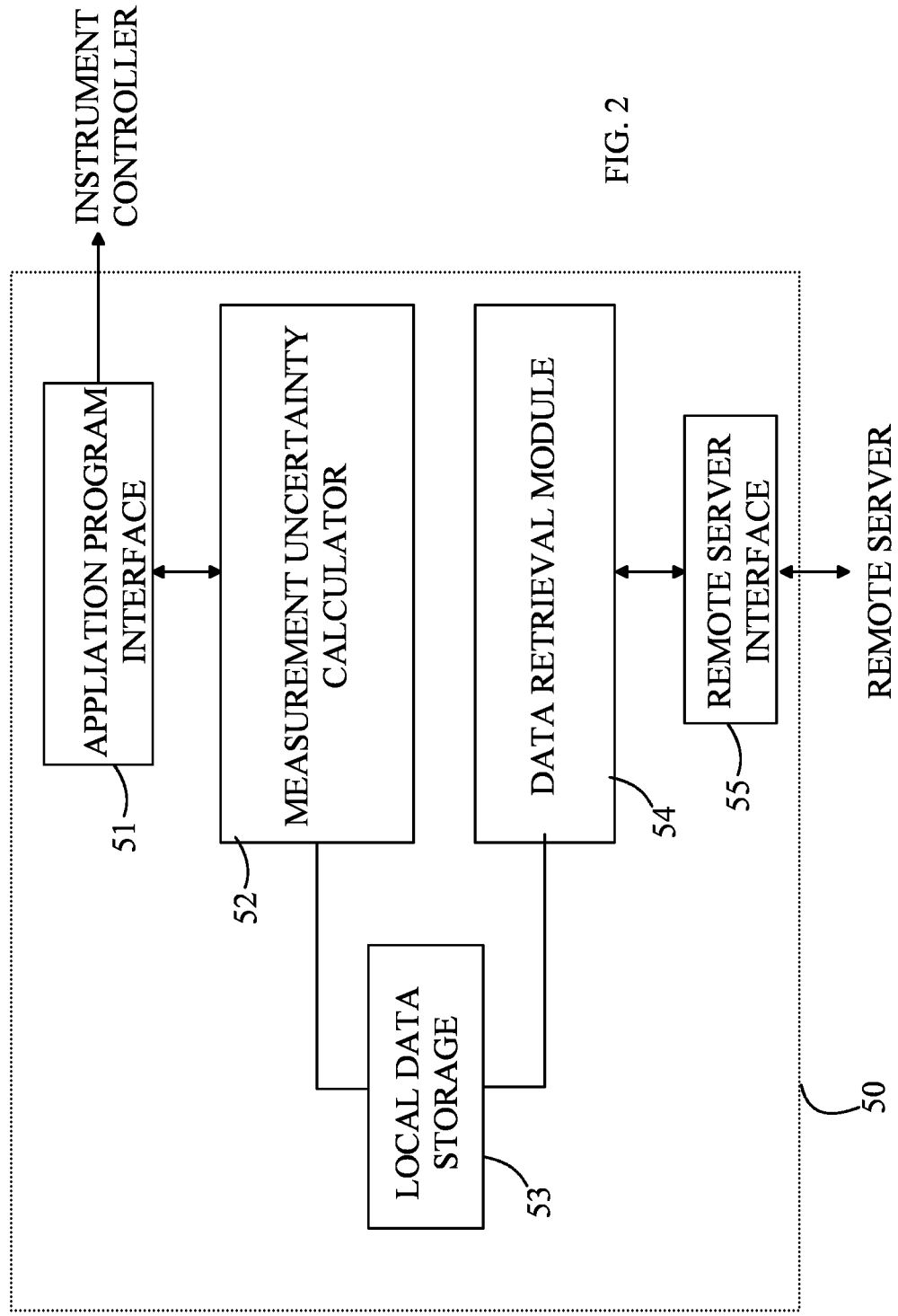
FIG. 2 illustrates a measurement uncertainty module (MUM) according to one embodiment of an instrument system according to the present disclosure.

Refer now to FIG. 2, which illustrates a MUM according to one embodiment of an instrument system according to the present disclosure. MUM 50 could be utilized in implementing error estimator 24 shown in FIG. 1. MUM 50 includes an application program interface (API) 51 that implements the interface between the instrument controller and MUM 50. API 51 provides a common interface that facilitates the use of MUM 50 with a plurality of instruments in the manufacturer's instrument line.

Measurement uncertainty calculator 52 provides the measurement uncertainty for the measurement currently being made by the instrument based on one of the models described above utilizing the model data stored in local data storage 53. In one aspect, the data stored in local data storage 53 is sufficient to provide the measurement uncertainty without reference to a more complete data set that is maintained in a remote server. In another aspect, the data stored in local data storage 53 is updated from a remote server by data retrieval module 54 which utilizes a remote server interface 55 to access the remote server if that server is currently available over a communication interface.

In one aspect, the data stored in local data storage 53 includes a PDF that provides an estimate of the measurement uncertainty for the measurement currently being made by the instrument connected to MUM 50. As noted above, that PDF depends on the environmental conditions in which the measurement is being made and on the particular settings such as input voltage range utilized by the sensor in question in the instrument.

In the above examples, it was assumed, for the sake of simplicity, that the instrument makes the measurement in question using a single sensor. However, more complex instruments utilizing multiple sensors to arrive at a measurement value can also utilize the measurement uncertainty system of the present disclosure. In such cases, the individual PDFs representing the sensors can be combined using Monte Carlo techniques, or other mathematical techniques, to arrive at an overall PDF that can be used to compute the measurement uncertainty under the current environmental conditions.

The data specifying the PDFs stored in local data storage 53 can be any of a number of formats. For example, a PDF could be specified as a predefined function with specific values for one or more parameters of that function, such as a normal distribution with values for the mean and standard deviation. In another example, the PDF could be specified by a table of values and an interpolation rule for calculating the PDF values. A combination of techniques can also be utilized. For example, a predefined function could be utilized with a table and interpolation rules for calculating one or more parameters based on other environmental values such as the temperature of the sensor and the measurement range utilized by the sensor.

The locally stored data can also include historical information about the sensor and/or instrument that can be relevant to the measurement uncertainty determinations. For example, the time period that has elapsed since the instrument was manufactured and/or calibrated can be relevant to the measurement uncertainty. The time from manufacture and the time from calibration are examples of environmental variables that can increase the measurement uncertainty. The longer the time period since calibration, the higher the measurement uncertainty.

In one aspect, for any given set of environmental variables, MUM 50 is utilized by an instrument to provide a measure of the measurement uncertainty for a sensor measurement that currently measures a value, Vm, utilizing the sensor. In this case, the controller provides a specified level of confidence, and measurement uncertainty calculator 52 provides a range of values around, Vm. The range is computed from the PDF associated with the sensor and the environmental variables during the measurement, such that when the instrument measures a value Vm when presented with a DUT that generates a signal having true value, V, V is within the range of values around Vm to within the specified confidence level. For example, a DVM is used to measure the voltage on a terminal. The measurement is reported at Vm volts. A user wants to know to within a specified level of confidence the range of values for values that the user would encounter if another DVM measured the same terminal.

Alternatively, the instrument controller could provide upper and lower uncertainty bounds for a specified measurement value, and measurement uncertainty calculator 52 provides the level of confidence that the instrument class error associated with the instrument is within the specified bounds.

While the above examples assume that each instrument coming off of the manufacturing lines is tested to provide an estimate of the instrument class error, embodiments in which a subset of the instruments in the class provide the measurements can also be practiced.

The above-described embodiments have been provided to illustrate various aspects of the invention. However, it is to be understood that different aspects of the present invention that are shown in different specific embodiments can be combined to provide other embodiments of the present invention. In addition, various modifications to the present invention will become apparent from the foregoing description and accompanying drawings. Accordingly, the present invention is to be limited solely by the scope of the following claims.

What is claimed is:

1. An instrument that measures a physical quantity, said instrument comprising:
    a sensor that measures said physical quantity and generates a value, Vm, for said physical quantity;
    an instrument class error calculator that provides an instrument class error associated with Vm; and
    a communication interface that transfers said instrument class error to an entity separate from said instrument, wherein said instrument is a member of a class of instruments and wherein said instrument class error calculator stores information specifying a PDF for Vm representing said instrument class errors across said class of instruments based on measurements made by other instruments in said class of instruments.

2. The instrument of claim 1 wherein said class error associated with Vm comprises VLow and VHigh, where VLow<Vm<VHigh and a probability of another instrument from said class providing a reading, V, when measuring said physical quantity is between VLow and VHigh for a percentage of the instruments in said class determined by a specified confidence level.

3. The instrument of claim 1 wherein said class error associated with Vm comprises specified values for a VLow and a VHigh, where VLow<Vm<VHigh and a probability of another instrument from said class providing a reading, V, when measuring said physical quantity is between VLow and VHigh for a percentage of the instruments in said class that has a confidence level determined by said instrument class error calculator.

4. The instrument of claim 1 wherein said other instruments were placed in service after said instrument.

5. The instrument of claim 1 wherein said PDF depends on a temperature at which said sensor is operating.

6. The instrument of claim 1 wherein said instrument belongs to a class of instruments and wherein said instrument further comprises a communication link that connects said instrument to a server that stores updated PDF information based on measurements of other instruments of said class that were produced after said instrument was placed in service.

7. The instrument of claim 1 wherein said PDF is chosen from predetermined list of candidate PDFs, each candidate PDF in said list including a free parameter that is determined by fitting said candidate PDFs to measurements made by a plurality of instruments in said class of instruments, said PDF being chosen to be said candidate PDF that best fits said measurements.

8. The instrument of claim 7 wherein said plurality of instruments in said class of instruments were placed in service after said instrument.

9. The instrument of claim 7 wherein said free parameter is increased to compensate for uncertainty in determining which candidate PDF best fitted said measurements.

10. An instrument system comprising:
    a plurality of instruments of a class of instruments that is manufactured on an ongoing basis, each instrument comprising:
    a sensor that measures a physical quantity and generates a value, Vm, for said physical quantity; and
    an instrument class error calculator that provides an instrument class error associated with Vm to a user of said instrument;
    a database that stores a measurement generated by each instrument in a sample of said instruments during manufacturer; and
    a communication link between said database and one of said instruments in said class that provides information on said instruments in said class based on measurements made after said one of said instruments in said class was manufactured.

11. The system of claim 10 wherein said instrument class error calculator stores information specifying a PDF for Vm representing said instrument class errors across said class of instruments based on measurements made on other instruments in said class of instruments.

12. The system of claim 10 comprising a controller that utilizes said database to specify a current PDF for said instruments in said class based on measurements made on said class of instruments.

13. The system of claim 12 wherein said controller communicates said current PDF to one of said instruments, said current PDF being based on measurements made on said class of instruments after said one of said instruments was placed into service.

14. The system of claim 12 wherein said current PDF depends on an environmental variable.

15. The system of claim 14 wherein said environmental variable is temperature.

16. A method for operating an instrument system comprising:
    a plurality of instruments of a class of instruments, each instrument comprising:

a sensor that measures a physical quantity and generates a value, Vm, for said physical quantity; and an instrument class error calculator that provides an instrument class error associated with Vm to a user of said instrument;

a database that stores a measurement generated by each instrument in a sample of said instruments; and a communication link between said database and one of said plurality of instruments in said class, said method comprising:

measuring a value for said physical quantity on a standard using selected ones of said instruments and storing information specifying said measured values in said database together with information specifying an environmental parameter associated with said measured values; and transmitting information specifying a new PDF for said physical quantity to said one of said instruments based on information stored in said database after said one of said instruments was placed in service.

17. The method of claim 16 wherein said measuring of said values of said physical quantity occurs after said one of said instruments was placed in service.

18. The method of claim 16 wherein said new PDF depends on an environmental parameter.

19. The method of 18 wherein said environmental parameter is temperature.

\* \* \* \* \*